United States Patent [19]

Groeger

[11] 4,014,007
[45] Mar. 22, 1977

[54] CIRCUIT ARRANGEMENT FOR PLACING INFORMATION IN A PROGRAMMABLE ECL READ ONLY MEMORY

[75] Inventor: Ingo Groeger, Munich, Germany

[73] Assignee: Siemens Aktiengesellschaft, Berlin & Munich, Germany

[22] Filed: Jan. 23, 1976

[21] Appl. No.: 651,767

[30] Foreign Application Priority Data

Feb. 7, 1975 Germany .......................... 2502285

[52] U.S. Cl. ...................... 340/173 R; 340/173 SP
[51] Int. Cl.² .................. G11C 11/40; G11C 17/00
[58] Field of Search ................. 340/173 R, 173 SP; 307/238

[56] References Cited

UNITED STATES PATENTS 3,739,355  6/1973  Radcliffe, Jr. ................. 340/173 R Primary Examiner—Terrell W. Fears
Attorney, Agent, or Firm—Hill, Gross, Simpson, Van Santen, Steadman, Chiara & Simpson

[57] ABSTRACT

A circuit arrangement for placing information in a programmable ECL read only memory includes storage elements each comprising a circuit element and an interruptable resistance arranged between row lines and column lines. Interruption of the resistances takes place by means of an externally specified current. A row switch is provided for each row line and comprises a differential amplifier having transistors which are connected in parallel and which are controlled by address signals, and a reference transistor. The row switch also comprises an emitter follower connected to the collectors of the operating transistors and to a row line. A switch is provided whose control input is connected to the reference transistor for the purpose of row line selection and whose controlled path is arranged between a switched operating voltage source and a row line. The switched operating voltage source has a first value during a reading operation in which the row line is not influenced by the switch and has a second value during the information storing operation, which value makes possible the current necessary in order to interrupt to resistances of the storage elements.

6 Claims, 10 Drawing Figures

CIRCUIT ARRANGEMENT FOR PLACING INFORMATION IN A PROGRAMMABLE ECL READ ONLY MEMORY

BACKGROUND OF THE INVENTION

1. Field of the Invention

This invention relates to a circuit arrangement for storing information in a programmable ECL read only memory, in which the storage elements consists of a circuit element and an interruptable resistor which are arranged between the row and column lines, and in which the interruption of the resistors takes place by means of an externally specified current, and in which a row switch is provided for each row line and consists of a differential amplifier having operating transistors connected in parallel and activated by address signals, and a reference transistor, and which also consists of an emitter follower connected to the collectors of the operating transistors and to a row line.

2. Description of the Prior Art

In programmable read only memories, in ECL technology, storage elements are arranged in a matrix form between row lines and column lines. The storage elements consist of a circuit element and an interruptable resistor. The circuit element, for example, may be a transistor or a diode. The interruptable resistor, for example, consist of NiCr. If the programmable read only memory is to have information stored therein, the resistors must be interrupted corresponding to the information which is to be stored. For example, a binary "1" corresponds to an interrupted resistor; a binary "0" corresponds to a non-interrupted resistor. Interruption of the resistors takes place by passing a correspondingly great externally specified current through the resistors. This is made possible to applying a correspondingly large voltage to the storage elements, and effecting a through connection of the circuit elements.

Therefore, a special circuit arrangement is necessary in order to input information into the programmable read only memory. If, for example, the storage elements are realized by means of a transistor and a storage resistor located in the emitter branch of the transistor, then, with the aid of such a circuit arrangement, a voltage is applied to the base of the storage transistor for the purpose of inputing the information, which voltage is of such a type that the current necessary in order to interrupt the storage resistor can flow over the collector-emitter path. After the information has been input into the programmable read only memory, the task of this circuit arrangement is ended. Thus, it must be designed in such a way that the cost of additionally required structural elements is minimal, and that the operation of the read only memory is not impaired by its presence.

SUMMARY OF THE INVENTION

Therefore, the object of the present invention is to provide a circuit arrangement for the purpose of storing or inputing information into a programmable ECL read only memory, which arrangement can operate with few additional structural elements, and which does not continue to affect the operation of the read only memory once the memory has had the information stored therein.

According to the invention, in a circuit arrangement of the type described above, the above object is achieved by providing a switch having a control input which is connected to a reference transistor for the purpose of line selection, and having a controlled path which is arranged between a switch selected operating voltage source and a roll line. The switch selected operating voltage source has a first value during a reading operation in which the row line is not affected by the switch and a second value during an information storage operation which makes possible the current required to interrupt the resistors of the storage elements.

Therefore, in the circuit arrangement of the present invention, the row switch, which is already necessary during the reading process, is additionally used in the storage operation. The row switch controls the circuit arrangement; namely, with the branch of the differential amplifier not used during the normal reading process.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
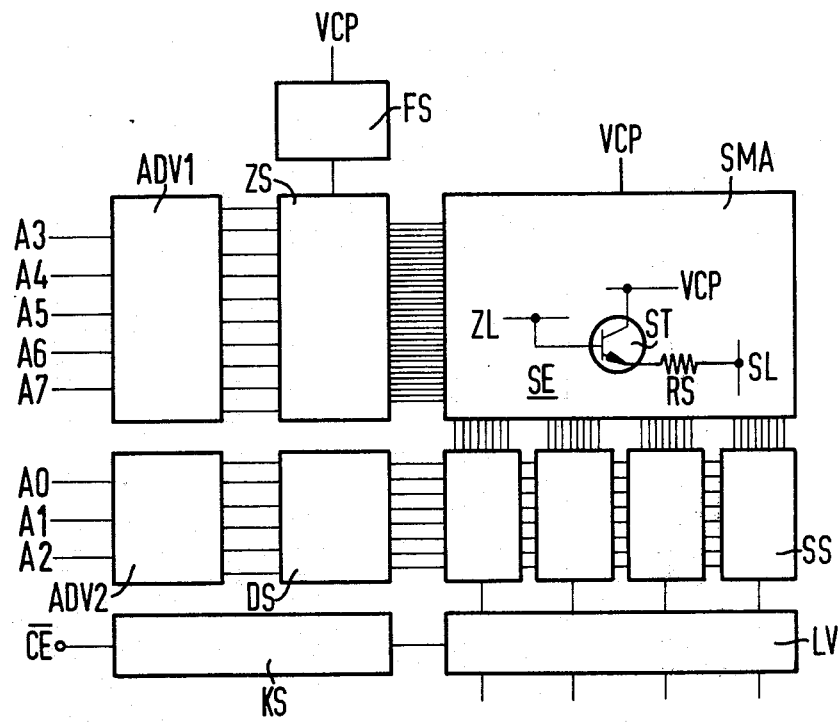
FIG. 1 is a block circuit diagram of a programmable read only memory of the type to which the present invention appertains.

Referring to FIG. 1, a storage matrix SMA comprises a plurality of storage elements SE arranged between horizontal row lines ZL and vertical column lines SL. The storage elements are arranged at the intersections of the row lines ZL and the column lines SL. In the exemplary embodiment illustrated, these storage elements comprise a storage transistor ST and a storage resistor RS connected in the emitter circuit of the transistor ST. The storage resistor RS is, for example, a NiCr resistor. In order to select row lines and/or column lines, address signals A0 to A7 are fed to the read only memory. The address signals for the row lines are amplified in an address amplifier ADV1 and the amplified address signals are then fed to row switches ZS in which the address signals are also decoded. Correspondingly, the address signals for the column lines are amplified in an address amplifier ADV2 and then fed to a decoder circuit DS. Four column switch groups SS are connected to the decoder circuit DS. The storage matrix, in particular, is constructed such that a specific number of column lines are integrated into one bank in each case. One group of columns switches each serves one bank of column lines. Read amplifiers LV are also connected to the column lines. An additional signal $\overline{CE}$ is fed to the storage module by means of which module selection is achieved. The signal $\overline{CE}$ is fed to the read amplifiers by way of a preparatory circuit KS. Finally, the circuit arrangement FS is additionally provided for the inputing of information, to which the switch selected operating voltage source VCP is connected.

Figure 2:
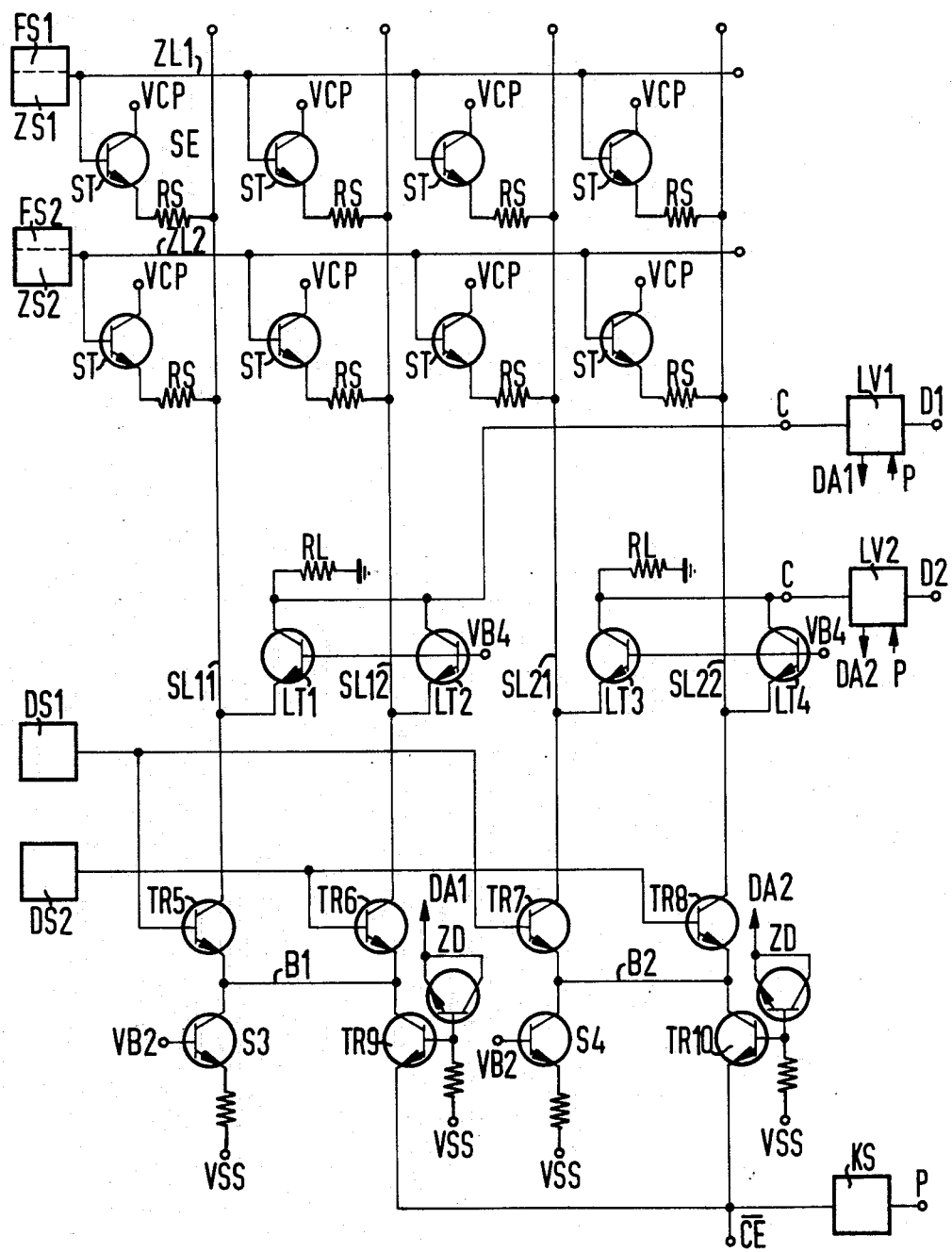
FIG. 2 is a schematic circuit diagram which illustrates a storage matrix.

A more precise embodiment of the storage matrix having the switching circuits directly connected to the row lines and to the column lines is illustrated in FIG. 2. In the exemplary embodiment of the invention illustrated, the storage matrix of the programmable ECL storage module consists of two row lines ZL1 and ZL2, and two banks, each having two column lines SL11 and SL12, and SL21 and SL22. The storage elements which comprise a storage transistor ST and a storage resistor RS are individually arranged between row lines ZL and column lines SL. The base of the storage transistor ST is connected to a row line ZL. The interruptable storage resistor RS is connected between the emitter of the storage transistor ST and a column line SL. The collector of the transistor ST is connected to the switch selected operating voltage source VCP.

The row lines ZL are connected, on the one side, to a respective row switch ZS, and to the circuit arrangement SS for inputing information. More specifically, the row line switch ZS1 and a circuit arrangement FS1 are connected to the row line ZL1 and a row switch ZS2 and a circuit arrangement FS2 are connected to the row line ZL2.

The one ends of the column lines SL are connected with an additional constant current source S3 or S4, respectively, via column switch transistors TR5, TR6 or TR7, TR8, respectively. The column switches TR5, TR6 and TR7, TR8 are additionally connected to the decoder circuits DS1 and DS2, respectively. Two column lines are integrated into one bank B via the column switch emitters; for example, the column lines SL11 and SL12 are integrated into a bank B1 and the column lines SL21 and SL22 are integrated into a bank B2. The emitters of the column switch transistors of each bank are connected to each other and, for the bank B1, lead to the collector of a transistor TR9, and, for the bank B2, lead to the collector of a transistor TR10, whose emitters are connected to the module selection input $\overline{CE}$. The base terminals of the transistors TR9 and TR10 are controlled with the aid of a resistance and a transistor ZD which is connected in such a way that is opens upon reaching a specific blocking voltage.

Figure 5:
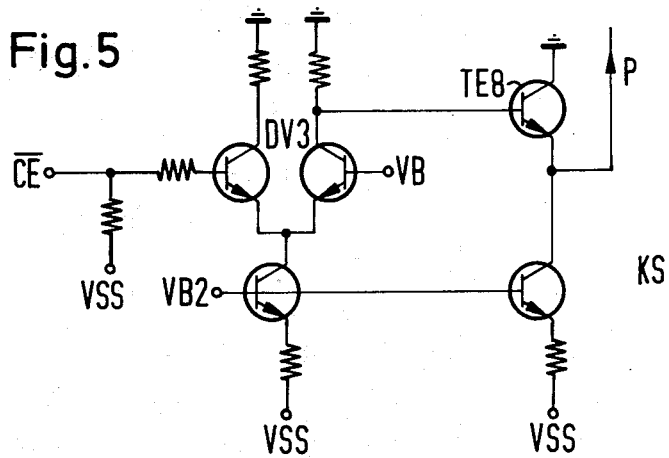
FIG. 5 is a schematic representation of a circuit arrangement for the preparation of the read amplifiers.

Read amplifiers LV1 and LV2 are also connected to the column lines SL; more specifically, one read amplifier each is connected to one bank of column lines. The coupling of the read amplifier LV to a column line SL takes place by way of a read transistor LT. For example, the read amplifier LV1 is connected to the column line SL11 via a read transistor LT1, and to the column line SL12 via a read transistor LT2. Correspondingly, the read amplifier LV2 is connected to the column line SL21 via a read transistor LT3, and to the column line SL22 via a read transistor LT4. One load resistor RL is connected in the collector circuits of the transistors LT of a respective bank of column lines. The base terminals of the read transistors LT are connected to a reference voltage VB4. The selection signal P is supplied to the read amplifier LV by way of a preparatory circuit KS (FIG. 5). In addition, the read amplifiers LV1 and LV2, respectively, are connected to points DA1 and DA2 of the transistors ZD. This is necessary in order to be able to control the transistors TR9 and TR10, respectively, via the outputs D1 and D2, respectively, of the read amplifiers LV1 and LV2 during inputing of information.

Figure 3:
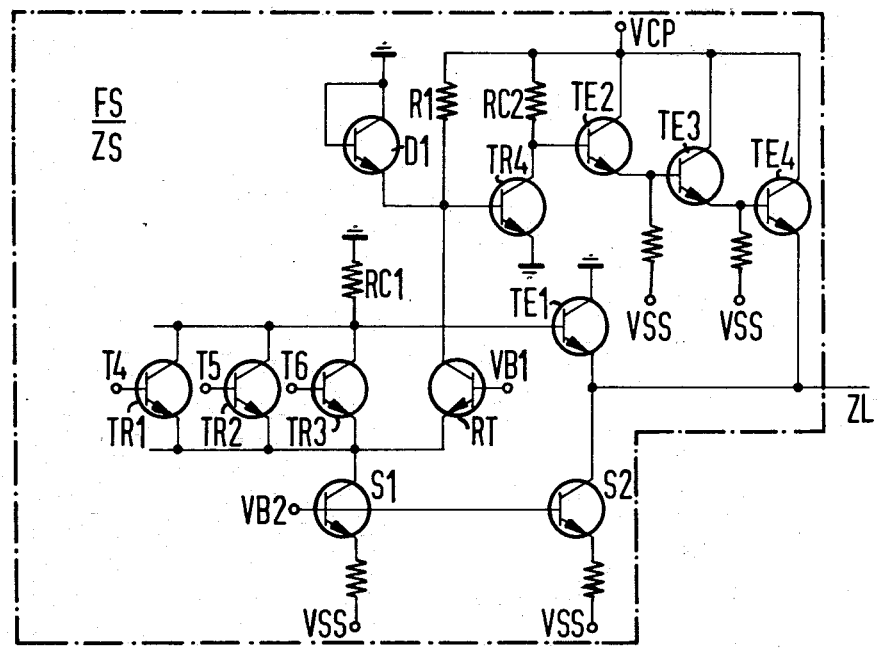
FIG. 3 is a schematic circuit diagram of a row switch, together with an exemplary embodiment of a circuit arrangement of the present invention for inputing information into the storage matrix.

The constant current source S are all constructed in the same manner and according to known methods. Each of these sources is controlled by a voltage VB2, and the voltage VSS1 is an additional operating voltage. Referring to FIG. 3, the construction of a row switch ZS and a circuit arrangement FS for inputing information is illustrated. The row switch ZS comprises a differential amplifier and an emitter follower connected to the differential amplifier. The differential amplifier is constructed of a plurality of control transistors TR1, TR2, TR3 connected in parallel and controlled by address signals, and a reference transistor RT, a constant current source S1 and a collector resistor RC1. The reference voltage VB1 is supplied to the base of the reference transistor RT. The base of the emitter follower transistor TE1 is connected to the collectors of the control transistors TR1, TR2 and TR3. The emitter of the transistor TE1 is connected to a row line ZL. In addition, the emitter of the transistor TE1 is connected to a constant current source S2. Both of the constant current sources are connected to a control voltage VB2. Since the construction of the row switch is known in the art, it is not necessary to go into a detailed explanation of the same, the decoding of address signals takes place with the aid of the differential amplifier. The line switch can be used for more than two row lines.

The circuit arrangement FS for inputting information into the read only memory comprises a transistor TR4 and three emitter follower stages TE2, TE3 and TE4 which are connected in a series chain. The collector of the reference transistor RT of the differential amplifier is connected to the base of the transistor TR4 and, via a resistor R1, to the switch selected voltage source VCP, and further to the emitter of a transistor D1 which is connected as a diode. The transistor TR4 has a resistor RC2 connecting its collector to the switch selected operating voltage source VCP. The transistor of the first emitter follower stage TE2 is connected to the collector of the transistor TR4. The following emitter follower stages are each connected to the emitter of the transistor of the preceding emitter follower stage. The emitter of the emitter follower transistor of the last stage is connected to the row line ZL.

In the operation of inputting information into the memory, the row line ZL is selected with the aid of the row switch, as in a normal reading operation. If the address signals T4, T5 and T6 are fed to control transistors TR1, TR2, TR3 of the differential amplifier are of such a type that the transistors TR1, TR2 and TR3 are blocked, then the assigned row line ZL is considered selected. In this case, the collector voltage of the controlled transistors TR1, TR2 and TR3 is transmitted to the row line ZL by way of the emitter follower TE1. Since only very small current flows through the collector resistor RC1, this voltage is approximately 0 volt, and a voltage of approximately 0.8 volt is then applied to the row line ZL. This voltage is subject to the base-emitter voltage of the emitter follower transistor TE1.

If, on the contrary, at least one of the address signals T4, T5, T6 has a value such that one of the control transistors TR1, TR2, TR3 is in the conductive state, then the current of the constant current source S1 flows by way of that particular control transistor and the collector resistor RC1. The greater voltage drop over the resistor RC1, effected by such current flow, causes a more negative collector voltage of the control transistors TR1, TR2, TR3, which is fed to the row line ZL via the emitter follower TE1. A voltage of −1.6 volt, for example, is applied to the row line ZL. A row line in such a condition is considered non-selected.

The operation of the row switch just described is utilized during the read operation as well as during the inputting of information into the storage matrix.

As long as information is read out of the storage matrix, the switch selected operating voltage source VCP is set at 0 volt. Then, the voltage on the selected row line ZL is such that the storage transistors ST connected to the selected row line ZL are placed in a conductive state. If a column line SL is also activated, the stored information can be read out of the storage element via the column line. If, on the contrary, the row line ZL is not selected, then the voltage applied to the row line is such that the storage transistors ST remain blocked. The stored information then cannot be read out.

During the inputting of information into the storage matrix, the switch selected operating voltage source VCP is set to a positive value, for example 6 volt. The selection of a row line ZL, however, again takes place by way of the row switch. In a non-selected row line, at least one of the control transistors TR1, TR2, TR3 of the assigned row switch is rendered conductive. However, the reference transistor RT of the row switch is then blocked. The transistor TR4 of the circuit arrangement FS for inputting information is, on the contrary, in the conductive state. However, in this case, a voltage is connected to the base of the transistor of the first emitter follower TE2 which is of a level to block the emitter follower. The emitter follower stages TE3 and TE4 are then likewise blocked. This means that the positive operating voltage VCP cannot reach the row line ZL by way of the emitter follower stages. Rather, the voltage on the row line ZL is determined by the emitter follower TE1 of the row switch as during the reading operation. However, this value is not so large that the storage transistors ST connected to the row line ZL are activated such that it would be possible for a current to flow which is sufficient to interrupt the storage resistances RS.

If, on the other hand, a row line ZL is selected, all of the control transistors TR1, TR2, TR3 of the differential amplifier are blocked and the reference transistor RT is then in a conductive state. Then, however, the circuit transistor TR4 of the circuit arrangement is transferred into a blocking state for the purpose of inputting information. The consequence is that a positive potential is applied to the base of the emitter follower TE2. This potential is transferred to the row line ZL via the following emitter follower stages TE3 and TE4. Then, a positive voltage of +3.5 volts, for example, is applied to the row line ZL. This voltage on the row line ZL is sufficient to render the conductive storage transistors ST connected to the selected row line, such that a sufficiently large current can flow and interrupt the storage resistors RS.

Figure 6:
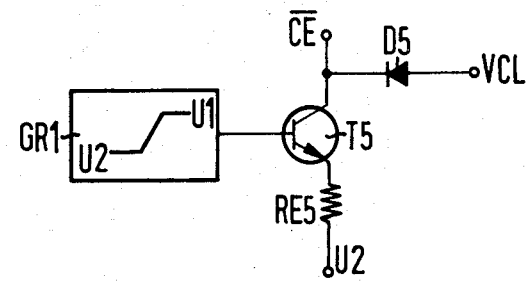
FIG. 6 is a schematic circuit diagram of a switchable circuit arrangement for providing the current necessary in order to interrupt the storage resistors.

In order to be able to select a specific storage element, the assigned column line must additionally be activated. This occurs with the aid of the decoder circuits DS1, DS2. The selection of the column line bank takes place by way of the signals at the points DA1 and DA2, respectively, which are activated from the data outputs D1 and D2, respectively. The specified current for interrupting a storage resistor can then flow over the input for the module selection signal $\overline{CE}$ (FIG. 6).

If, for example, information is written into the storage element SE, i.e. if the resistor RS1 is interrupted, then the row line ZL1 is selected by the row switch ZS1, and a positive voltage of approximately +3.5 volt is connected to the row line ZL1 by means of the circuit arrangement FS. In addition, the column decoder DS1 activates the column switch transistor TR5. Likewise, a voltage is connected to the point DA1 by way of the output D1 of the read amplifier LV1, which activates the transistor TR9. Thus, a current path is provided from the switch selected operating voltage source VCP, via the storage element SE, the column switch transistor TR5 and the transistor TR9, to the input of the selection signal $\overline{CE}$. Therefore, the current necessary in order to interrupt the storage resistor RS1 can flow from the switch selected operating voltage source VCP to the input of the selection signals $\overline{CE}$. The storage resistor RS is interrupted by this current and the desired information is thereby stored in the storage element SE. Every storage element may be selected and undergo information input in the manner just described.

In the circuit arrangement FS for inputting information into the storage matrix SMA, an additional diode D1 is inserted. This is necessary in order to apply a defined collector voltage to the reference transistor RT of the differential amplifier during the reading operation. Otherwise, in the event that the reference transistor RT is in the conductive state, a current of a comparatively high value would flow through the resistor R1 and produce a voltage drop by way of which the operation of the line switch would be disturbed.

Figure 4:
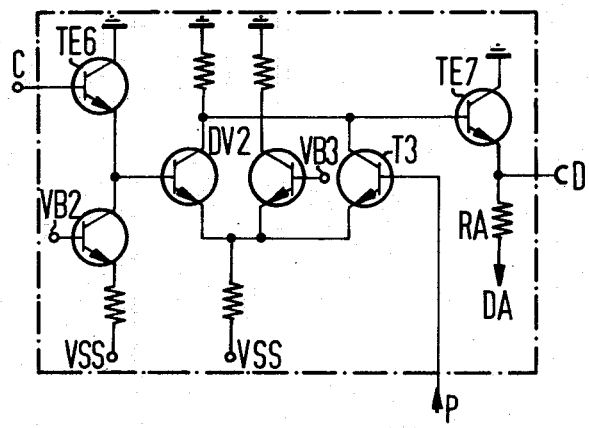
FIG. 4 is a schematic circuit diagram of a read amplifier.

An embodiment of a read amplifier LV is illustrated in FIG. 4. Its construction is of interest because the output D of the read amplifier is used for the selection of a column line bank B. For this purpose, a corresponding voltage is connected to the output D, which voltage is connected to the point DA of the bases of the transistors TR9 and TR10, respectively, by way of a resistor RA. In this manner, a potential is supplied to the base of the transistor TR9 and to the base of the transistor TR10, respectively, by means of which these transistors are brought into the conductive state. The remaining component elements of the read amplifier are not necessary for inputting information into the storage matrix, and therefore are not treated in further detail herein. The read amplifier comprises an emitter follower TE6, a differential amplifier DV2, and an additional emitter follower TE7. The read amplifier is switched on with the aid of the transistor T3, and VB3 is a reference voltage.

FIG. 5 illustrates a circuit arrangement KS for preparing the read amplifier LV. Through the circuit arrangement KS, the module selection signal $\overline{CE}$ is brought into a form which is suitable for activating the read amplifier LV. The circuit arrangement comprises a differential amplifier DV3 and an emitter follower TE8, the potential VB constituting a reference voltage.

The decoder circuits DS can basically be constructed corresponding to the row switch (FIG. 3) whereby, however, the output potentials of the decoder circuits differ from the output potentials of a row switch.

FIG. 6 illustrates a switchable circuit arrangement for producing a specified current in order to interrupt the storage resistors. This circuit arrangement is not arranged on the storage module. Therefore, the current is externally supplied to the storage module, in particular, at the input for the module selection signal $\overline{CE}$. The circuit arrangement contains a generator GR1 which produces two voltages U1 and U2 having a gradient therebetween as illustrated on the drawing at the generator GR1. The output of the generator GR1 is connected to the base of a circuit transistor T5. The circuit transistor T5 is connected to the voltage U2 by way of an emitter resistor RE5. A diode D5 is connected to the collector of the transistor T5 and is also connected to a recovery potential VCL. The collector of the circuit transistor T5 is connected to the input of the module selection signal $\overline{CE}$. The diode D5 prevents the collector voltage from dropping too strongly.

Figure 7:
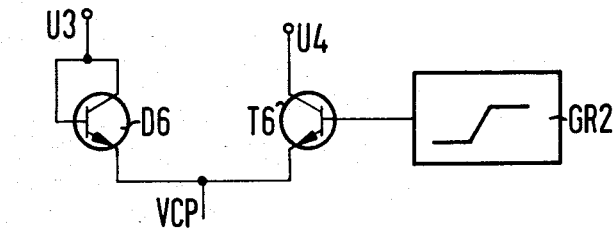
FIG. 7 is a schematic circuit diagram illustrating a switch-selected operating voltage source.

From FIG. 7 the production of the operating voltage VCP from the operating voltages U3 and U4 is illustrated. The circuit comprises a transistor T6, a transistor D6 connected as a diode, and a generator GR2 connected to the base of the transistor T6. The generator GR2 applies 2 voltages to the base of the transistor T6, which voltages are of the type illustrated in the block of the generator GR2 and through which the transistor T6 is turned on and off. The switch selected operating voltage VCP is tapped at the emitter of the transistor T6 which is coupled to the diode D6. The circuit arrangement according to FIG. 7 is likewise not illustrated on the storage module.

Figure 8:
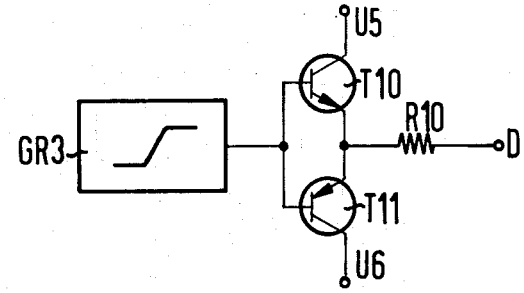
FIG. 8 is a schematic circuit diagram illustrating switchable selection voltage.

In FIG. 8, a circuit is illustrated which is connected to the output D of the read amplifier LV. The column line bank is selected with the aid of this circuit. The circuit comprises a generator GR3, two complementary transistors T10 and T11 whose base terminals and whose emitter terminals are interconnected, and a resistor R10 connected between the emitters of the transistors T10 and T11 and the terminal D. A voltage U5 is connected to the collector of the transistor T10, and a voltage U6 is connected to the collector of the transistor T11. The generator GR3, at one time, switches on the transistor T10 and, at another time, switches on the transistor T11. The circuit illustrated in FIG. 8 is also not arranged on the storage module.

Figure 9:
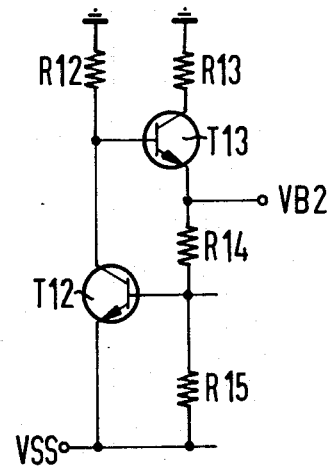
FIG. 9 is a schematic circuit diagram which illustrates an arrangement for producing a reference voltage.

FIG. 9 illustrates a circuit arrangement by means of which a reference voltage VB2 can be produced. It comprises a pair of transistors T12, T13 and a plurality of resistors R12, R13, R14 and R15 which are interconnected in a well known manner, the operation of the circuit being readily apparent to those skilled in the art and not discussed in detail herein.

Figure 10:
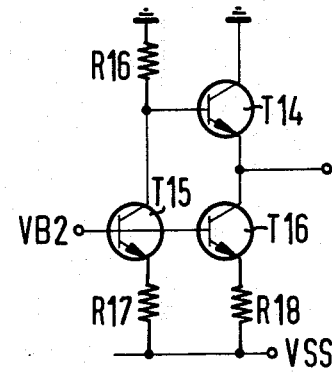
FIG. 10 is a schematic circuit diagram of an arrangement for producing an additional reference voltage.

FIG. 10 illustrates a circuit for obtaining the remaining reference voltages VB, VB1, VB3, VB4, VB5, and specifically illustrating a circuit provided for obtaining the reference voltage VB2. The circuit is constructed of three transistors T14, T15 and T16, and three resistors R16, R17 and R18. The reference voltages emitted from the circuit can, of course, be of different magnitude, depending on the values of the elements employed, as will be readily apparent to those skilled in the art.

The advantage of the circuit arrangement constructed in accordance with the present invention lies in the fact that the arrangement is switched on only by the switching over of a voltage source. However, selection of the row line takes place through the row switch, as in the read operation. For this reason, the costs of the circuit constructed in accordance with the present invention can be kept very low. An additional advantage is that the power required in order to input the information into the storage matrix is supplied exclusively by the switch selected voltage source. The normal function of the storage matrix and its control is not impaired by the circuit arrangement of the present invention.

As an aid in understanding the invention, the following schedule of voltages was found to be advantageously effective in a particular design.

VB = −1.29 V
VB1 = −1.0 V
VB2 = −3.7 V
VB3 = −1.05 V
VB4 = 1.3 V (−1.8V)
VB5 = −1.7V

With these potentials the voltage on a column line during interruption was approximately −2.5V; the read output voltage on a column line was about −1.3V; the read current was about 2 mA; and the current for interrupting a resistor RS was in the range of 20–30 mA.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a programmable read-only memory of the type having a matrix of intersecting column and row lines with a respective storage cell at and connecting the lines at the individual intersections, each storage cell having a circuit element connected to one of the lines and a current interruptable resistor connecting the circuit element to the other of the lines, column selection means for selecting column lines, and row switches connected to the row lines for selecting rows in response to address signals, each row switch comprising a differential amplifier having parallel connected control transistors controlled by the address signals and a reference transistor, and an emitter follower connecting the collectors of the control transistors to the respective row line, the improvement therein comprising:

an input for connection to a switched voltage source to receive a first voltage during a reading operation and a second voltage during an information input operation; and switch means for each row switch including a current path connected between said input and the associated row line and a control input connected to the reference transistor of the differential amplifier, said switch means operated by said row switch upon selection of the associated row line and ineffective with respect to the row line when said input receives the first voltage and effective when said input receives the second voltage to support a current flow which is necessary for interrupting the storage cell resistors assigned to the associated row line and to selected column lines.

2. The improved memory of claim 1, wherein said switch means comprises:
- a switching transistor having a base, an emitter and a collector, said emitter connected to a reference potential;
- a first resistor connecting said base to said input;
- a second resistor connecting said collector to said input; and
- a plurality of emitter-follower stages connected in a series chain, each of said stages connected to said input, the first stage of the chain connected to said collector of said transistor and the last stage of the chain connected to a row line.

3. The improved memory of claim 2, wherein each of said emitter-follower stages comprises a transistor having a collector, an emitter and a base, said collector connected to said input, said base of the first stage connected to said collector of said switching transistor and each of the other bases connected to said emitter of the transistor of the previous stage, and a resistor connecting the base and emitter of adjacent stages to a predetermined potential.

4. The improved memory of claim 3, comprising:
- a diode connected to the junction of the base of said switching transistor and said first resistor and to a reference potential.

5. The improved memory of claim 4, wherein said diode is constituted by a transistor having an emitter connected to said junction and an collector and a base connected together and to the reference potential.

6. The improved memory of claim 4, wherein the circuit element of each storage cell comprises:
- a transistor having a base connected to appertaining row line, an emitter connected to the appertaining column line, and a collector connected to the switched voltage source.

* * * * *